(12) United States Patent
Achenbach et al.

(10) Patent No.: US 11,964,617 B2
(45) Date of Patent: *Apr. 23, 2024

(54) VEHICULAR VISION SYSTEM WITH FORWARD VIEWING CAMERA MODULE

(71) Applicant: MAGNA ELECTRONICS INC., Auburn Hills, MI (US)

(72) Inventors: Garret F. Achenbach, Rochester Hills, MI (US); Brian A. Gorman, Burton, MI (US); Brian F. Smith, Macomb, MI (US); Steven G. Gebauer, Oxford, MI (US)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/347,756

(22) Filed: Jul. 6, 2023

(65) Prior Publication Data

US 2023/0339412 A1 Oct. 26, 2023

Related U.S. Application Data

(63) Continuation of application No. 17/813,050, filed on Jul. 18, 2022, now Pat. No. 11,697,382, which is a (Continued)

(51) Int. Cl.
*B60R 11/04* (2006.01)
*B60R 1/00* (2022.01)
(Continued)

(52) U.S. Cl.
CPC .............. *B60R 11/04* (2013.01); *B60R 1/00* (2013.01); *H04N 7/181* (2013.01); *H04N 23/57* (2023.01); *H05K 7/2039* (2013.01)

(58) Field of Classification Search
CPC ... B60R 11/04; B60R 1/00; B60R 2011/0026; B60R 2001/1253; H04N 5/2257;
(Continued)

(56) References Cited

U.S. PATENT DOCUMENTS

| 4,634,884 A | 1/1987 | Hayashimoto et al. |
| 5,096,287 A | 3/1992 | Kakinami et al. |

(Continued)

FOREIGN PATENT DOCUMENTS

| DE | 102008044003 A1 | 5/2010 |
| DE | 102010023593 A1 | 12/2011 |

(Continued)

*Primary Examiner* — Jared Walker
(74) *Attorney, Agent, or Firm* — HONIGMAN LLP

(57) ABSTRACT

A vehicular vision system includes a camera module having a housing that houses at least (i) electronic circuitry disposed at a main printed circuit board (PCB) and (ii) an imager assembly. The imager assembly includes an imaging array sensor, an imager PCB and a lens holder that includes an elongated lens barrel that houses at least one lens. Electronic circuitry is disposed at an upper side and at a lower side of the main PCB. Image data captured by the imaging array sensor is conveyed to electronic circuitry disposed at the main PCB. An electronic component of electronic circuitry disposed at the main PCB is in thermal conductivity with a thermal element, which is in thermal conductivity with a lower housing portion of the housing to enhance heat transfer from the electronic component to the lower housing portion of the camera housing.

37 Claims, 6 Drawing Sheets

Related U.S. Application Data continuation of application No. 17/249,703, filed on Mar. 10, 2021, now Pat. No. 11,390,223, which is a continuation of application No. 16/806,100, filed on Mar. 2, 2020, now Pat. No. 10,946,813, which is a continuation of application No. 16/283,920, filed on Feb. 25, 2019, now Pat. No. 10,576,908, which is a continuation of application No. 15/899,131, filed on Feb. 19, 2018, now Pat. No. 10,214,157, which is a continuation of application No. 14/705,076, filed on May 6, 2015, now Pat. No. 9,896,039.

(60) Provisional application No. 61/990,927, filed on May 9, 2014.

(51) Int. Cl.
 *H04N 7/18* (2006.01)
 *H04N 23/57* (2023.01)
 *H05K 7/20* (2006.01)

(58) Field of Classification Search
 CPC ........ H04N 7/181; H04N 23/51; H04N 23/55; H05K 7/2039; G06V 20/56; G06V 20/58; G06V 20/588; G06V 10/147; G06T 2207/30252
 See application file for complete search history.

(56) References Cited

U.S. PATENT DOCUMENTS

| | | |
|---|---|---|
| 5,130,804 A | 7/1992 | Tamura |
| 5,204,615 A | 4/1993 | Richards et al. |
| 5,550,677 A | 8/1996 | Schofield et al. |
| 5,587,236 A | 12/1996 | Agrawal et al. |
| 5,670,935 A | 9/1997 | Schofield et al. |
| 5,796,094 A | 8/1998 | Schofield et al. |
| 5,877,897 A | 3/1999 | Schofield et al. |
| 5,920,061 A | 7/1999 | Feng |
| 5,949,331 A | 9/1999 | Schofield et al. |
| 6,087,953 A | 7/2000 | DeLine et al. |
| 6,097,023 A | 8/2000 | Schofield et al. |
| 6,124,886 A | 9/2000 | DeLine et al. |
| 6,151,065 A | 11/2000 | Steed et al. |
| 6,172,613 B1 | 1/2001 | DeLine et al. |
| 6,243,003 B1 | 6/2001 | DeLine et al. |
| 6,250,148 B1 | 6/2001 | Lynam |
| 6,259,475 B1 | 7/2001 | Ramachandran et al. |
| 6,278,377 B1 | 8/2001 | DeLine et al. |
| 6,313,454 B1 | 11/2001 | Bos et al. |
| 6,320,176 B1 | 11/2001 | Schofield et al. |
| 6,326,613 B1 | 12/2001 | Heslin et al. |
| 6,329,925 B1 | 12/2001 | Skiver et al. |
| 6,341,523 B2 | 1/2002 | Lynam |
| 6,353,392 B1 | 3/2002 | Schofield et al. |
| 6,396,397 B1 | 5/2002 | Bos et al. |
| 6,420,975 B1 | 7/2002 | DeLine et al. |
| 6,428,172 B1 | 8/2002 | Hutzel et al. |
| 6,445,287 B1 | 9/2002 | Schofield et al. |
| 6,466,136 B2 | 10/2002 | DeLine et al. |
| 6,498,620 B2 | 12/2002 | Schofield et al. |
| 6,501,387 B2 | 12/2002 | Skiver et al. |
| 6,559,435 B2 | 5/2003 | Schofield et al. |
| 6,593,565 B2 | 7/2003 | Heslin et al. |
| 6,690,268 B2 | 2/2004 | Schofield et al. |
| 6,768,422 B2 | 7/2004 | Schofield et al. |
| 6,774,356 B2 | 8/2004 | Heslin et al. |
| 6,795,237 B1 | 9/2004 | Marinelli et al. |
| 6,806,452 B2 | 10/2004 | Bos et al. |
| 6,822,563 B2 | 11/2004 | Bos et al. |
| 6,824,281 B2 | 11/2004 | Schofield et al. |
| 6,831,261 B2 | 12/2004 | Schofield et al. |
| 6,953,253 B2 | 10/2005 | Schofield et al. |
| 6,968,736 B2 | 11/2005 | Lynam |
| 7,004,593 B2 | 2/2006 | Weller et al. |
| 7,095,572 B2 | 8/2006 | Lee et al. |
| 7,188,963 B2 | 3/2007 | Schofield et al. |
| 7,205,904 B2 | 4/2007 | Schofield |
| 7,215,479 B1 | 5/2007 | Bakin |
| 7,262,406 B2 | 8/2007 | Heslin et al. |
| 7,265,342 B2 | 9/2007 | Heslin et al. |
| 7,289,037 B2 | 10/2007 | Uken et al. |
| 7,311,406 B2 | 12/2007 | Schofield et al. |
| 7,325,934 B2 | 2/2008 | Schofield et al. |
| 7,339,149 B1 | 3/2008 | Schofield et al. |
| 7,344,261 B2 | 3/2008 | Schofield et al. |
| 7,355,524 B2 | 4/2008 | Schofield |
| 7,388,182 B2 | 6/2008 | Schofield et al. |
| 7,402,786 B2 | 7/2008 | Schofield et al. |
| 7,420,159 B2 | 9/2008 | Heslin et al. |
| 7,423,248 B2 | 9/2008 | Schofield et al. |
| 7,425,076 B2 | 9/2008 | Schofield et al. |
| 7,480,149 B2 | 1/2009 | DeWard et al. |
| 7,526,103 B2 | 4/2009 | Schofield et al. |
| 7,533,998 B2 | 5/2009 | Schofield et al. |
| 7,536,316 B2 | 5/2009 | Ozer et al. |
| 7,538,316 B2 | 5/2009 | Heslin et al. |
| 7,551,103 B2 | 6/2009 | Schofield |
| 7,579,939 B2 | 8/2009 | Schofield et al. |
| 7,616,781 B2 | 11/2009 | Schofield et al. |
| 7,655,894 B2 | 2/2010 | Schofield et al. |
| 7,679,498 B2 | 3/2010 | Pawlicki et al. |
| 7,697,027 B2 | 4/2010 | McMahon et al. |
| 7,728,721 B2 | 6/2010 | Schofield et al. |
| 7,877,175 B2 | 1/2011 | Higgins-Luthman |
| 7,888,629 B2 | 2/2011 | Heslin et al. |
| 7,916,009 B2 | 3/2011 | Schofield et al. |
| 7,918,570 B2 | 4/2011 | Weller et al. |
| 7,946,505 B2 | 5/2011 | Lynam et al. |
| 7,965,336 B2 | 6/2011 | Bingle et al. |
| 7,972,045 B2 | 7/2011 | Schofield |
| 7,994,462 B2 | 8/2011 | Schofield et al. |
| 8,063,759 B2 | 11/2011 | Bos et al. |
| 8,070,332 B2 | 12/2011 | Higgins-Luthman et al. |
| 8,090,153 B2 | 1/2012 | Schofield et al. |
| 8,142,059 B2 | 3/2012 | Higgins-Luthman et al. |
| 8,162,518 B2 | 4/2012 | Schofield |
| 8,179,437 B2 | 5/2012 | Schofield et al. |
| 8,194,133 B2 | 6/2012 | DeWind et al. |
| 8,203,440 B2 | 6/2012 | Schofield et al. |
| 8,222,588 B2 | 7/2012 | Schofield et al. |
| 8,223,203 B2 | 7/2012 | Ohsumi et al. |
| 8,239,086 B2 | 8/2012 | Higgins-Luthman |
| 8,254,011 B2 | 8/2012 | Baur et al. |
| 8,256,821 B2 | 9/2012 | Lawlor et al. |
| 8,289,142 B2 | 10/2012 | Pawlicki et al. |
| 8,294,608 B1 | 10/2012 | Lynam |
| 8,314,689 B2 | 11/2012 | Schofield et al. |
| 8,324,552 B2 | 12/2012 | Schofield et al. |
| 8,325,986 B2 | 12/2012 | Schofield et al. |
| 8,339,453 B2 | 12/2012 | Blake et al. |
| 8,355,839 B2 | 1/2013 | Schofield et al. |
| 8,376,595 B2 | 2/2013 | Higgins-Luthman |
| 8,386,114 B2 | 2/2013 | Higgins-Luthman |
| 8,405,725 B2 | 3/2013 | McMahon et al. |
| 8,405,726 B2 | 3/2013 | Schofield et al. |
| 8,451,332 B2 | 5/2013 | Rawlings |
| 8,513,590 B2 | 8/2013 | Heslin et al. |
| 8,529,075 B2 | 9/2013 | Yamada et al. |
| 8,531,278 B2 | 9/2013 | DeWard et al. |
| 8,534,887 B2 | 9/2013 | DeLine et al. |
| 8,629,768 B2 | 1/2014 | Bos et al. |
| 8,665,079 B2 | 3/2014 | Pawlicki et al. |
| 8,743,203 B2 | 6/2014 | Karner et al. |
| 8,851,690 B2 | 10/2014 | Uken et al. |
| 8,944,655 B2 | 2/2015 | Verrat-Debailleul et al. |
| 9,150,165 B1 | 10/2015 | Fortin et al. |
| 9,156,403 B2 | 10/2015 | Rawlings et al. |
| 9,160,908 B2 | 10/2015 | Mori et al. |
| 9,233,641 B2 | 1/2016 | Sesti et al. |
| 9,487,159 B2 | 11/2016 | Achenbach |
| 9,596,387 B2 | 3/2017 | Achenbach et al. |
| 9,871,971 B2 | 1/2018 | Wang et al. |

(56) References Cited

U.S. PATENT DOCUMENTS

| | | |
|---|---|---|
| 9,896,039 B2 | 2/2018 | Achenbach et al. |
| 10,214,157 B2 | 2/2019 | Achenbach et al. |
| 10,576,908 B2 | 3/2020 | Achenbach et al. |
| 10,946,813 B2 | 3/2021 | Achenbach et al. |
| 11,390,223 B2 | 7/2022 | Achenbach et al. |
| 11,697,382 B2 | 7/2023 | Achenbach et al. |
| 2003/0169522 A1 | 9/2003 | Schofield et al. |
| 2005/0141106 A1 | 6/2005 | Lee et al. |
| 2006/0050018 A1 | 3/2006 | Hutzel et al. |
| 2006/0077575 A1 | 4/2006 | Nakai et al. |
| 2006/0103727 A1 | 5/2006 | Tseng |
| 2007/0221826 A1 | 9/2007 | Bechtel et al. |
| 2008/0252882 A1 | 10/2008 | Kesterson |
| 2009/0244361 A1 | 10/2009 | Gebauer et al. |
| 2009/0295181 A1 | 12/2009 | Lawlor et al. |
| 2010/0110192 A1 | 5/2010 | Johnston et al. |
| 2010/0134616 A1 | 6/2010 | Seger et al. |
| 2010/0165468 A1 | 7/2010 | Yamada et al. |
| 2010/0279438 A1 | 11/2010 | An et al. |
| 2011/0025850 A1 | 2/2011 | Maekawa et al. |
| 2011/0298925 A1 | 12/2011 | Inoue et al. |
| 2012/0008129 A1 | 1/2012 | Lu et al. |
| 2012/0013741 A1 | 1/2012 | Blake, III et al. |
| 2012/0081550 A1 | 4/2012 | Sewell |
| 2012/0265416 A1 | 10/2012 | Lu et al. |
| 2013/0002873 A1 | 1/2013 | Hess |
| 2013/0076905 A1 | 3/2013 | Blake et al. |
| 2013/0242099 A1 | 9/2013 | Sauer et al. |
| 2013/0293771 A1 | 11/2013 | Mori et al. |
| 2014/0015977 A1 | 1/2014 | Taylor et al. |
| 2014/0043465 A1 | 2/2014 | Salomonsson et al. |
| 2014/0055671 A1 | 2/2014 | Kawamura |
| 2014/0160284 A1 | 6/2014 | Achenbach et al. |
| 2014/0168507 A1 | 6/2014 | Renaud |
| 2014/0226012 A1 | 8/2014 | Achenbach |
| 2014/0298642 A1 | 10/2014 | Sesti et al. |
| 2014/0321064 A1 | 10/2014 | Bose et al. |
| 2014/0354878 A1 | 12/2014 | Winter et al. |
| 2014/0373345 A1 | 12/2014 | Steigerwald |
| 2015/0015713 A1 | 1/2015 | Wang et al. |
| 2015/0029337 A1 | 1/2015 | Uchiyama et al. |
| 2015/0124098 A1 | 5/2015 | Winden et al. |
| 2015/0146094 A1 | 5/2015 | Seger et al. |
| 2015/0222795 A1 | 8/2015 | Sauer et al. |
| 2015/0251605 A1 | 9/2015 | Uken et al. |
| 2015/0327398 A1 | 11/2015 | Achenbach et al. |
| 2015/0365569 A1 | 12/2015 | Mai et al. |
| 2016/0037028 A1 | 2/2016 | Biemer |

FOREIGN PATENT DOCUMENTS

| | | |
|---|---|---|
| EP | 0889801 A1 | 1/1999 |
| EP | 1025702 A1 | 8/2000 |
| EP | 1504276 A2 | 2/2005 |
| JP | 2007243550 A | 9/2007 |
| WO | 2008024639 A2 | 2/2008 |
| WO | 2008127752 A2 | 10/2008 |
| WO | 2009046268 A1 | 4/2009 |
| WO | 2011111465 A1 | 9/2011 |
| WO | 2013019795 A1 | 2/2013 |
| WO | 2013081984 A1 | 6/2013 |
| WO | 2013081985 A1 | 6/2013 |
| WO | 2013103548 A1 | 7/2013 |
| WO | 2013123161 A1 | 8/2013 |

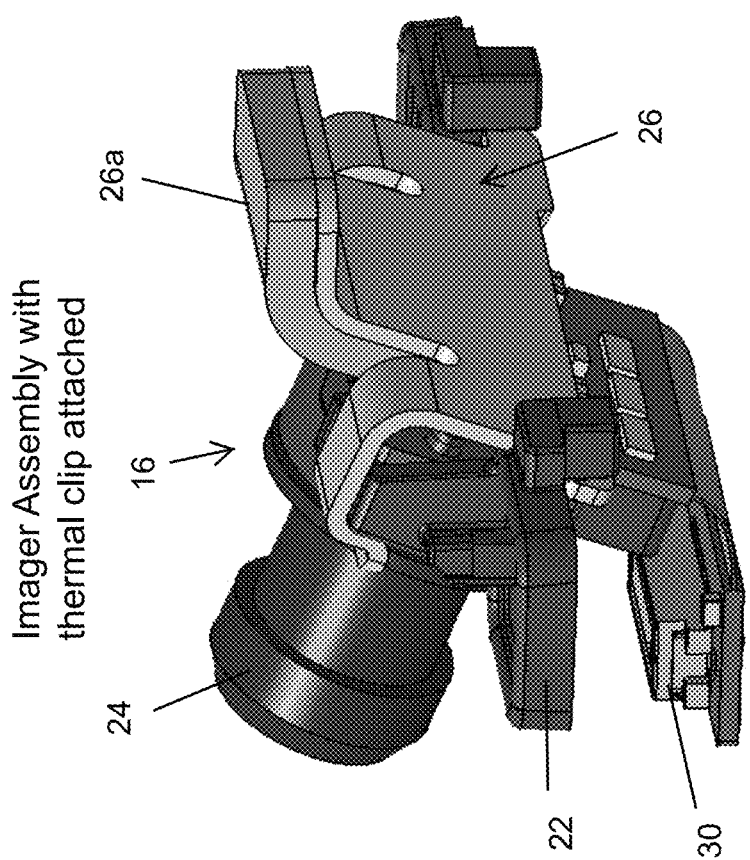
FIG. 7
Imager Assembly with thermal clip attached
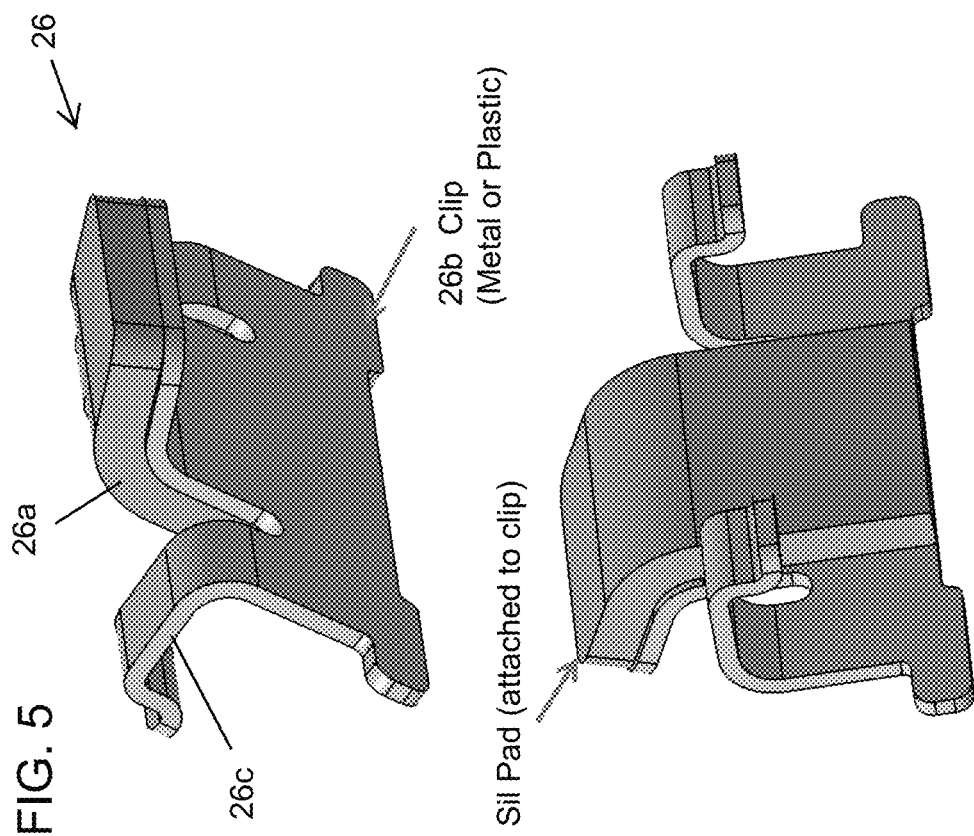
FIG. 5
FIG. 6

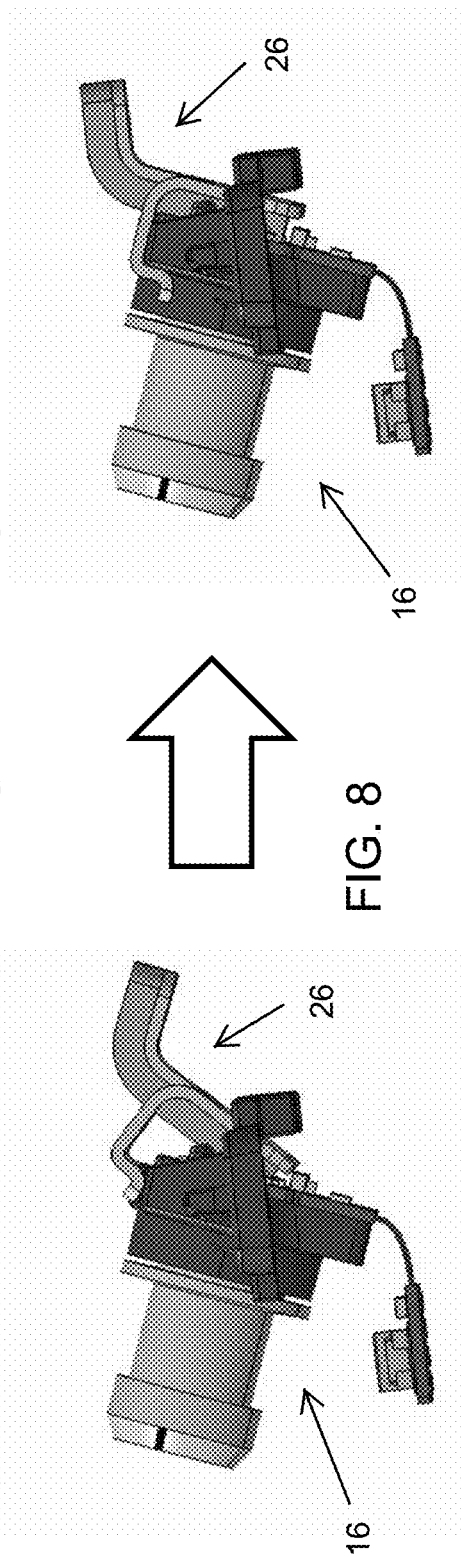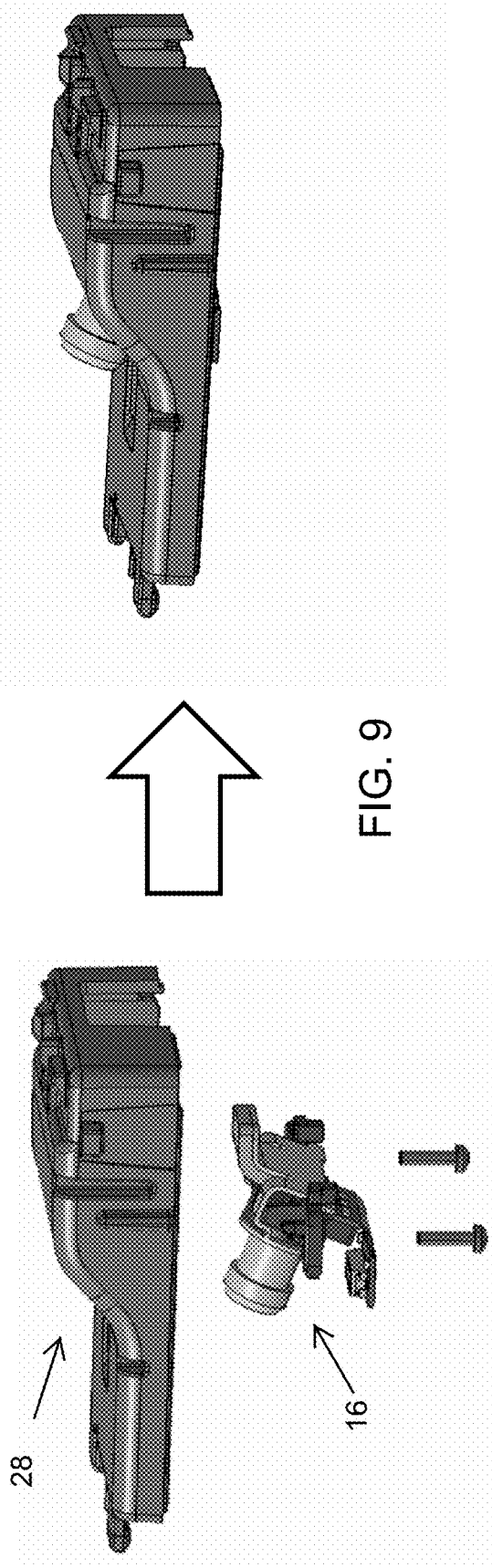

VEHICULAR VISION SYSTEM WITH FORWARD VIEWING CAMERA MODULE

CROSS REFERENCE TO RELATED APPLICATIONS

The present application is a continuation of U.S. patent application Ser. No. 17/813,050, filed Jul. 18, 2022, now U.S. Pat. No. 11,697,382, which is a continuation of U.S. patent application Ser. No. 17/249,703, filed Mar. 10, 2021, now U.S. Pat. No. 11,390,223, which is a continuation of U.S. patent application Ser. No. 16/806,100, filed Mar. 2, 2020, now U.S. Pat. No. 10,946,813, which is a continuation of U.S. patent application Ser. No. 16/283,920, filed Feb. 25, 2019, now U.S. Pat. No. 10,576,908, which is a continuation of U.S. patent application Ser. No. 15/899,131, filed Feb. 19, 2018, now U.S. Pat. No. 10,214,157, which is a continuation of U.S. patent application Ser. No. 14/705,076, filed May 6, 2015, now U.S. Pat. No. 9,896,039, which claims the filing benefits of U.S. provisional application Ser. No. 61/990,927, filed May 9, 2014, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems, such as for machine vision applications in vehicles, is known. Packaging of forward facing imagers is also known, such as described in U.S. Pat. Nos. 7,262,406; 7,265,342; 7,420,159; 7,480,149; 7,533,998; 7,538,316; 7,916,009; 8,179,437 and/or 8,405,726, which are hereby incorporated herein by reference in their entireties. Examples of known vision systems are described in U.S. Pat. Nos. 8,324,552; 8,314,689; 8,289,142; 8,222,588; 8,239,086; 8,203,440; 7,994,462; 7,655,894; 7,339,149; 7,344,261; 7,459,664; 7,423,248; 6,097,023; 5,949,331; 5,670,935 and 5,550,677, which are hereby incorporated herein by reference in their entireties.

SUMMARY OF THE INVENTION

The present invention provides a vision system or imaging system for a vehicle that utilizes one or more cameras to capture images exterior of the vehicle, and provides communication/data signals, including camera data or image data, which may be displayed or processed to provide the desired display images and/or processing and control, depending on the particular application of the camera and vision or imaging system. The camera module is configured to attach at the vehicle windshield and an interior rearview mirror assembly may attach at the module or at a bracket of the module. The camera module includes a thermal element that attaches at an imager assembly with a thermally conductive pad engaging the imager circuit board or PCB and engaging the camera module housing, so as to provide thermal transfer of heat generated by the imager and imager PCB during operation of the imager away from the imager and imager PCB and to the outer casing or housing of the camera module. The present invention thus provides enhanced thermal transfer and dissipation of heat generated by the camera during operation and thus may provide enhanced performance of the camera, particularly during operation of the camera at high ambient temperatures and the like.

These and other objects, advantages, purposes and features of the present invention will become apparent upon review of the following specification in conjunction with the drawings.

BRIEF DESCRIPTION OF THE DRAWINGS

FIGS. 5 and 6 are perspective views of the thermal pad or element of the present invention;

FIG. 7 is a perspective view of the thermal pad or element, shown attached at the imager PCB;

FIG. 8 shows how the thermal pad or element of the present invention is attached at the imager assembly and imager PCB; and FIG. 9 shows how the imager assembly, with the thermal pad or element attached thereto, is attached at the camera module casing or housing.

DESCRIPTION OF THE PREFERRED EMBODIMENTS

Figure 1:
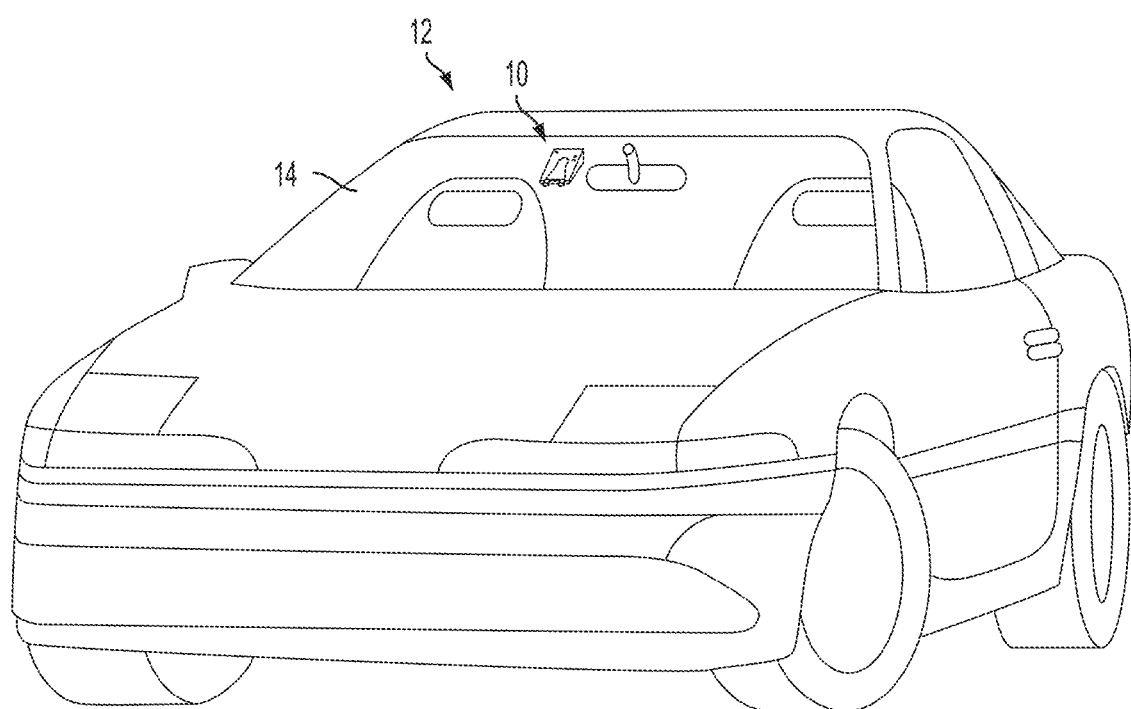
FIG. 1 is a perspective view of a vehicle having a vehicular camera system and forward facing camera of the present invention.
Figure 2:
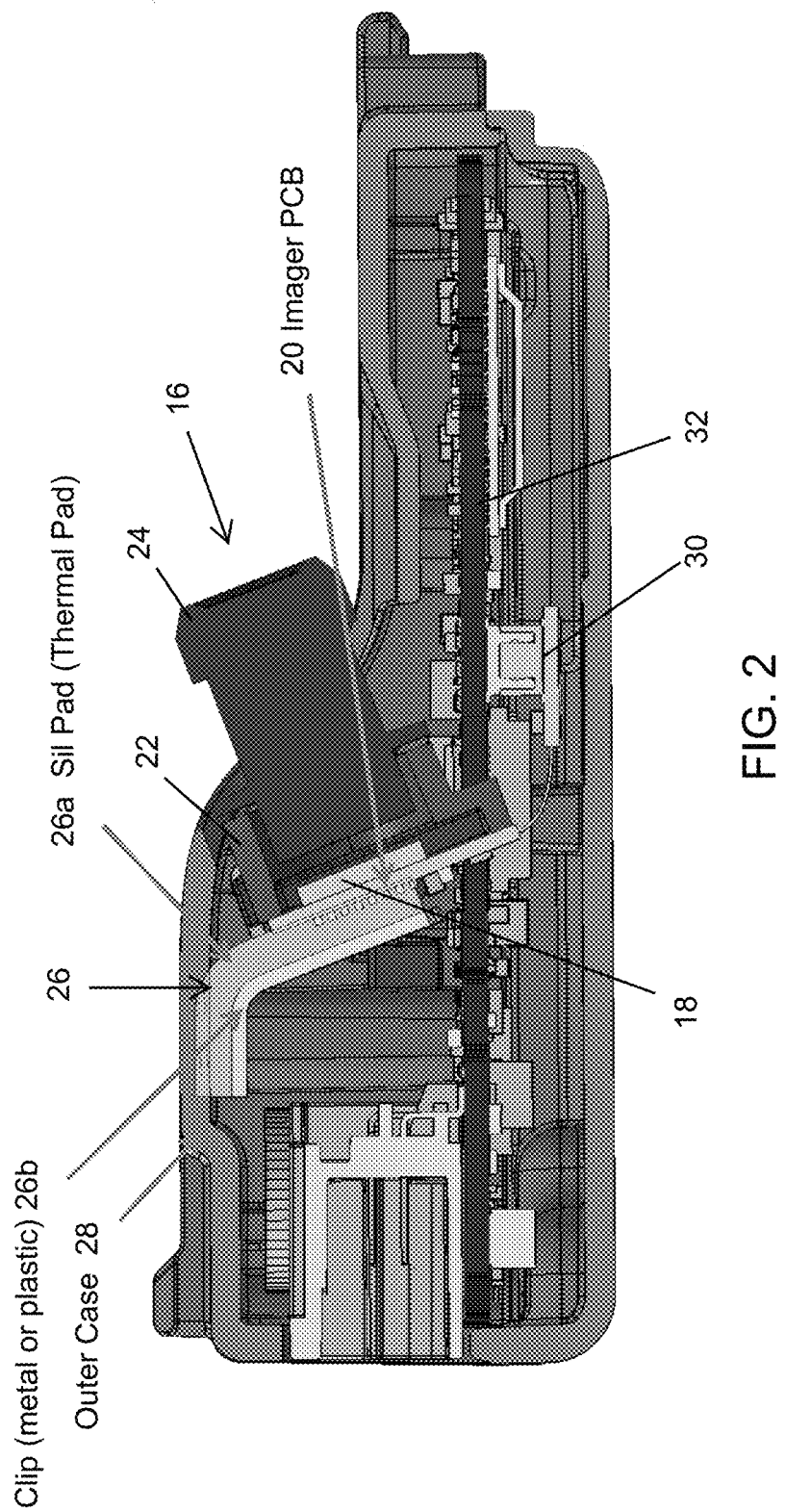
FIG. 2 is a side sectional view of the forward facing camera module of the present invention, shown with the thermal pad or element disposed at and engaging the imager PCB and the outer case or housing of the camera module.

A vehicular camera system can be installed on the inside of the front windshield of a vehicle, such as a car, truck, bus, or van. Such a camera system may be used for a variety of functions such as object detection, lane keeping, and high beam control. FIG. 1 shows an example of a vehicular camera system or module 10 configured to be attached in a front-facing manner to a vehicle 12, such as at a windshield 14 of a vehicle 12. The camera system 10 includes an imager assembly 16, which has an imager 18 established at an imager circuit board or PCB 20, and an imager housing or structure 22 and a lens barrel 24 attached at the structure 22 and optically aligned at and focused at the imager 18 (FIG. 2). The camera module 10 includes a thermal element or pad or bridge or conduit 26 that is attached at or disposed at the imager PCB 20 to thermally conductively connect the imager PCB 20 to the outer housing or casing 28 of the camera module 10, as discussed below.

The camera system or camera module of the present invention may utilize aspects of the systems and/or modules described in International Publication Nos. WO 2013/123161 and/or WO 2013/019795, and/or U.S. Pat. Nos. 8,256,821; 7,480,149; 7,289,037; 7,004,593; 6,824,281; 6,690,268; 6,445,287; 6,428,172; 6,420,975; 6,326,613; 6,278,377; 6,243,003; 6,250,148; 6,172,613 and/or 6,087,953, and/or U.S. Publication Nos. US-2014-0226012 and/or US-2009-0295181, which are all hereby incorporated herein by reference in their entireties.

The imager structure or housing 22 is configured to support the imager PCB 20 and lens barrel 24 so that the imager assembly 16 is attachable or mountable at the module housing or casing 28 as a unit. In the illustrated embodiment, the housing 22 is configured to attach at an upper housing portion of module casing 28, whereby the lens barrel is angled relative to the upper housing portion of casing 28 and relative to a main or primary or module circuit board 32 in the camera module casing 28. The imager assembly 16 includes an electrical connector 30 that extends from the imager circuit board 20 for electrical connection to the module circuit board 32 when the imager assembly is disposed at or in the module.

The front camera module is widely used to the automotive industry for vehicle detection and accident avoidance. One challenge is to maintain the imager's operating temperature within an acceptable range even during operation at high ambient temperatures (such as during operation of the camera on a hot sunny day, where the vehicle cabin at or near the windshield often reaches temperatures in excess of 100 degrees F.). A thermal pad may be sandwiched between the PCB and the outer case or housing, in order to draw the heat from the component to the outer ambient temperature. This method is not typically suitable for use with a forward facing camera module application, because the imager PCB is not parallel to the outer cover.

The present invention keeps the imager below its maximum operational temperature at high ambient temperatures, without parallel surfaces for thermal conduction. The present invention provides a thermal element or heat pipe 26 that is clipped or otherwise attached to or disposed at the imager assembly 16 (such as clipped to the imager structure or housing and in contact with or in close proximity to the imager PCB). The thermal element 26 comprises a thermal pad or sil pad 26a that is disposed at a clip or support element 26b (such as a metallic or plastic or polymeric element or the like), which attaches at the imager assembly 16. When so attached, the heat pipe thermally connects the thermal pad or sil pad to the imager PCB. The imager assembly is then installed into the outer cover, which thermally connects the thermal pad or sil pad to the outer cover. These two connections allow the heat to travel from the imager PCB to outside the camera, thus cooling the imager (see FIGS. 2 and 3).

The thermal element or heat pipe of the present invention equalizes the sil pad pressure between both the outer case and the imager PCB. Because the thermal clip is attached to the imager PCB and allowed to rotate, the pressure is equalized between the upper case and the imager assembly (such as can be seen with reference to FIG. 4).

Figure 3:
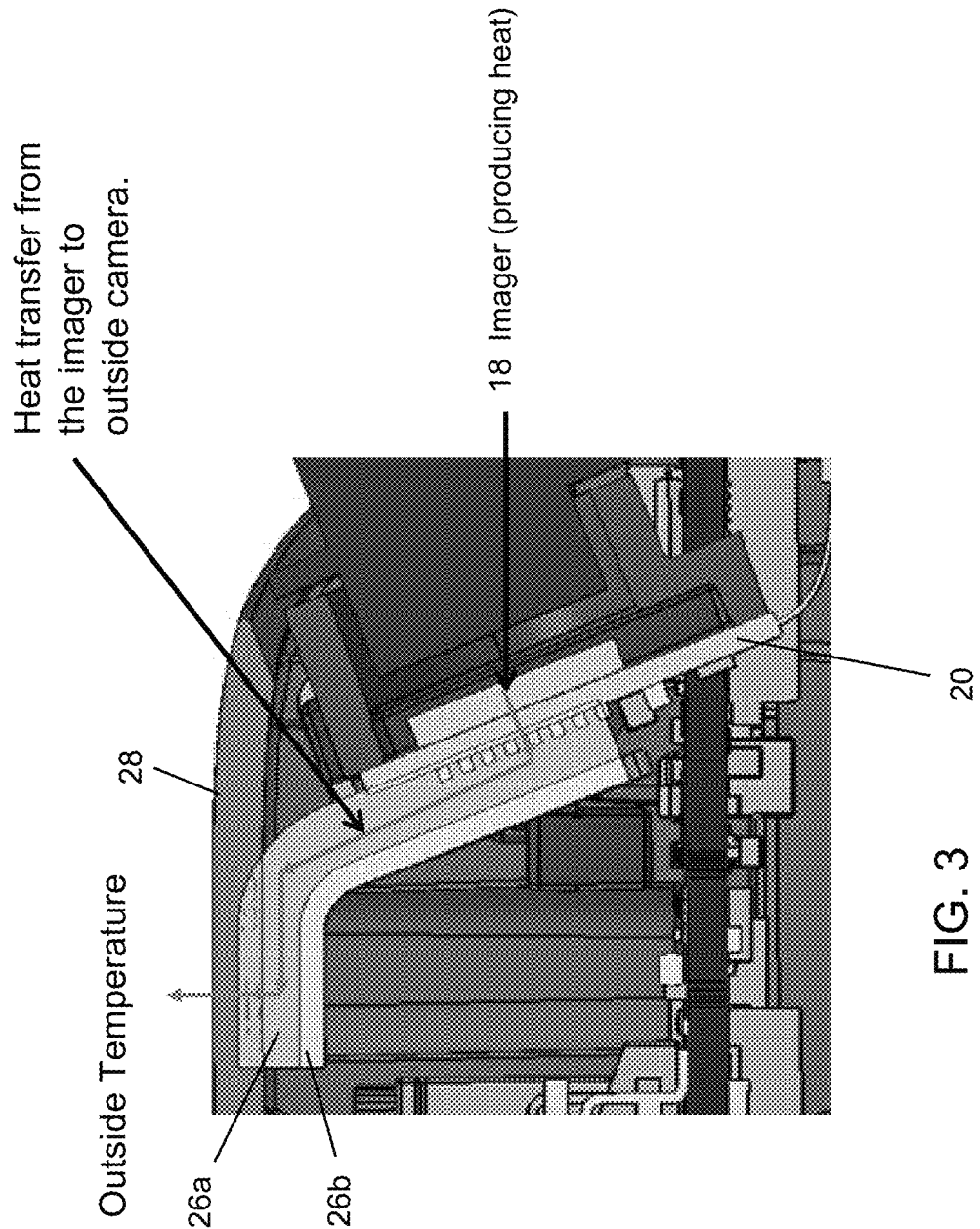
FIG. 3 is an enlarged sectional view of the thermal pad or element of FIG. 2, showing the heat transfer from the imager to outside of the camera module.
Figure 4:
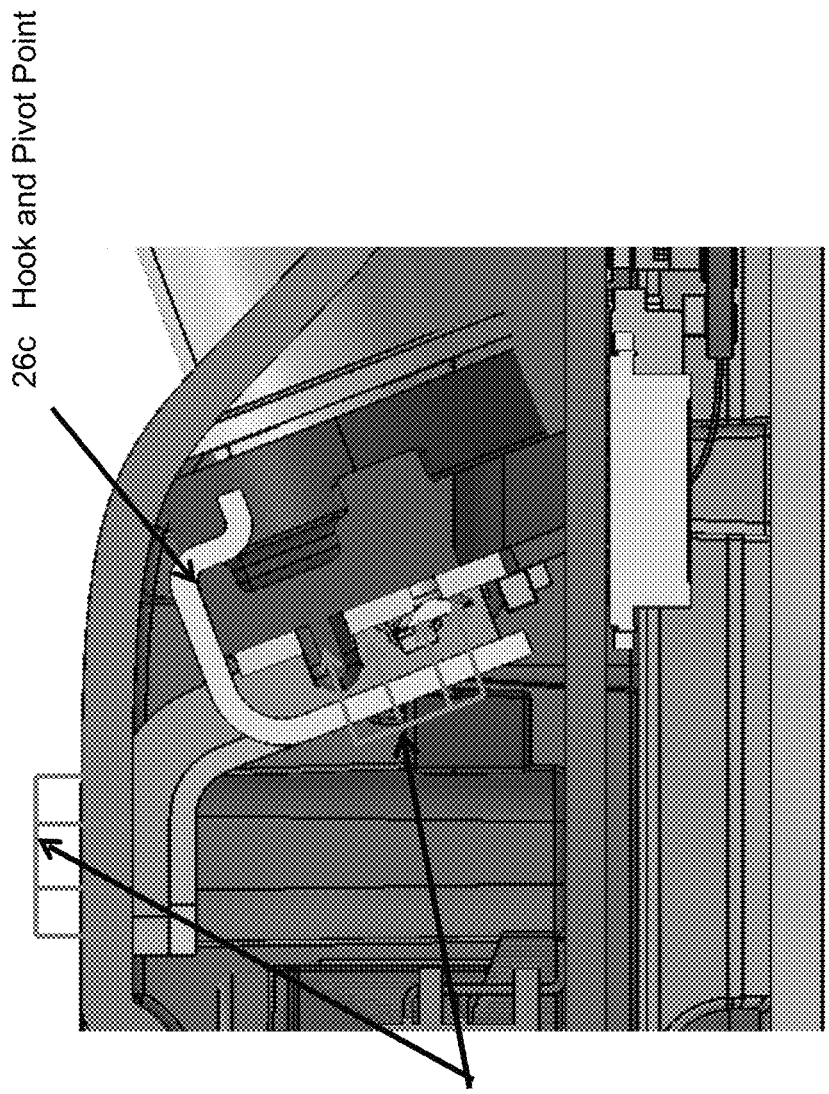
FIG. 4 is another enlarged sectional view of the thermal pad or element, showing attachment of the thermal pad or element at the imager PCB.

As shown with reference to FIGS. 4-8, the thermal pad 26a of thermal element 26 is disposed along the clip 26b, with the clip 26b having a pair of tabs or arms 26c that are configured to attach or clip or snap onto the imager housing or structure 22. For example, and as shown in FIG. 8, the arms 26c may be configured to hook over attaching portions of the imager housing 22, whereby the thermal element may be pivoted at the imager PCB to snap or clip the arms onto the housing to hold the thermal pad 26a against the back surface of the imager PCB 20, with substantially uniform pressure at the thermal pad where it engages the imager PCB. When so attached, a first or PCB portion of the clip 26b and pad 26a extend along the imager PCB 20 and a second or casing portion of the clip and pad extend at an angle relative to the imager PCB, whereby, when the imager assembly 16 (with the thermal element attached or clipped thereto) is attached at the camera housing 28 (such as via fasteners or the like) such as shown in FIG. 9, the second portion of the pad 26a engages the camera housing 28 (which is non-parallel to the imager PCB), such as shown in FIGS. 2-4. When the imager assembly is so attached or fastened at the camera module or housing, the electrical connector 30 of the imager PCB 20 may be electrically connected to or plugged into a corresponding connector of the main PCB 32 of the camera module (such as shown in FIG. 2) to electrically connect circuitry of the imager PCB with circuitry of the main PCB of the camera module.

Thus, and as can be seen with reference to FIG. 3, the thermal pad 26a allows for heat transfer of heat produced or generated by the imager 18 at the imager PCB 20 (during operation of the imager) along the thermal pad 26a and to the outer housing 28 and thus to the outside or exterior of the camera assembly. The configuration of the thermal element, when attached at the imager PCB and engaged at the outer case, provides pressure contact with the rear surface of the imager PCB and with the interior surface of the outer case, thereby providing enhanced thermal conduction between the imager PCB and the outer case. The thermal pad may comprise any suitable material, and preferably is compressible so that the pad may compress when engaged with the imager PCB and the outer case to enhance the contacts (and preferably is electrically isolating or non-electrically conducting). For example, the thermal pad material may comprise a Gap Pad VO Ultra Soft material, commercially available from The Bergquist Company of Chanhassen, MN, or a THERM-A-GAP HCS10 material, commercially available from Parker Hannifin of Cleveland, OH, or the like. Optionally, the outer housing 28 may include slots or apertures or fins or the like at the region where the thermal pad contacts the housing to enhance heat transfer and dissipation of the transferred heat at the outer housing.

Therefore, the present invention provides a thermal element or heat transfer element that is disposed between and in contact with the imager PCB of the imager assembly and the outer housing or casing of the camera module. The thermal element is attached or clipped to the imager assembly so that a thermal pad portion is substantially uniformly engaged with the imager PCB, and the thermal element is configured such that, when the imager assembly is attached at the camera module or housing, another thermal pad portion of the thermal element engages or is pressed against the camera housing so that the thermal pad of the thermal element or clip provides thermal connection or conductivity or a thermal pipe or conduit between the imager PCB and the camera module's outer housing or casing. Optionally, a thermally conductive paste may be disposed at the imager PCB and/or at the inner surface of the housing (at the points of contact of the thermal pad) to enhance thermal conductivity to and from the thermal pad. Thus, the present invention provides for enhanced thermal control of the imager assembly and thus enhanced operation of the imager assembly and forward facing camera, by drawing heat away from the imager PCB during operation of the camera. Although shown as a clip or element that attaches at an imager PCB to draw heat from the imager PCB, the thermal element may clip or attach at or to other electronic elements (such as at PCBs of other imagers or rain sensors or photosensors or other electronic accessories or the like) to draw heat away from the respective PCB to a respective outer housing or structure (that may be non-parallel to the PCB) during operation of the respective element or accessory, while remaining within the spirit and scope of the present invention.

The forward facing camera module is configured to attach at a mounting bracket that is configured to attach at the vehicle windshield, such as via direct adhesive attachment of the bracket to the windshield or via attachment of the bracket to one or more attaching elements that are adhesively attached at the windshield (such as by utilizing aspects of the modules described in U.S. Publication Nos. US-2014-0226012 and/or US-2009-0295181, which are hereby incorporated herein by reference in their entireties). Although not shown, the mirror mounting portion may be made larger to enhance attachment of the bracket at the windshield surface. A suitable adhesive joint to directly attach the bracket to the windshield (or to attach the likes of three or four attachment posts/pins/elements to hold the bracket at the windshield) is formed by curing 3M structural bonding tapes (such as 9214, or 9270 or 9263) in an autoclave process during fabrication of a laminated windshield such as disclosed in U.S. Pat. No. 5,587,236, which is hereby incorporated herein by reference in its entirety. Such 3M structural bonding tapes are available from 3M Company of St. Paul, MN and are modified epoxy adhesive tapes. Alternately, a urethane or a silicone adhesive can be used.

The camera module comprises the outer housing that houses the camera or imager assembly, and may include a stray light baffle or shield attached at the housing. The camera module, and its housing and camera and shield, may be similar to the camera module components described in U.S. Publication No. US-2014-0226012, and/or International Publication Nos. WO 2013/123161 and/or WO 2013/019795, which are hereby incorporated herein by reference in their entireties.

The camera module may attach at the bracket via any suitable means, and may detachably attach so that the camera module may be detached for service or replacement while the bracket remains attached at the windshield surface. When mounted at the bracket that is attached at the windshield of the vehicle, the stray light shield is disposed generally at the in-cabin surface of the windshield so that the camera views through or across the recess established by the light shield and through the windshield, such as through an aperture or region of the windshield that is devoid of an opaque hiding layer or frit layer or the like. Further, a shield gasket may be positioned on the frame or bracket around the lens to reduce incursion of dust, particulate, or moisture into the vicinity of the lens. The gasket may utilize aspects of the gaskets described in U.S. patent application Ser. No. 12/393, 223, filed Feb. 26, 2009, which is hereby incorporated herein by reference in its entirety. Optionally, the system may have a separate light shield or the light shield may be part of the bracket itself, such as by utilizing aspects of the systems described in U.S. Pat. No. 6,824,281, which is hereby incorporated herein by reference in its entirety.

Because of the number of components established at the main circuit board of the camera module, it is desirable to have the main circuit board comprise a double sided PCB with circuitry and components established at both sides of the circuit board. The flexible connector or cable of the imager assembly provides LVDS signals conveying image data captured by the imager to the image processor of the main circuit board. Alternately, image data captured by the imager may be conveyed to the image processor via the likes of Ethernet or by the protocols described in U.S. Pat. No. 7,697,027, which is hereby incorporated herein by reference in its entirety. The aperture or opening or hole in the main circuit board provides for passage of the flexible connector through the circuit board so as to establish electrical connection to the opposite side of the main circuit board, and the aperture or opening or hole in the main circuit board also at least partially receives a portion of imager assembly (such as a portion of the imager circuit board and/or imager and/or lens holder and/or lens) to provide a lower profile camera system or module.

Optionally, the camera module may include ventilation means for ventilating the module at the windshield (such as by utilizing aspects of the modules described in U.S. Publication No. US-2009-0295181 and/or U.S. patent application Ser. No. 12/393,223, filed Feb. 26, 2009, which are hereby incorporated herein by reference in their entireties). For example, the ventilation means may comprise one or more vents or ports or ventilation openings (such as a vent or port or opening established through the housing and/or gasket and/or frame or the like), a gas permeable and fluid impermeable material, a baffle that passes air and that blocks moisture, and/or a breathable membrane and/or the like. Such ventilation means may be provided to reduce moisture or fogging of the windshield at the viewing area of the camera or imager. Optionally, a localized heater element or grid may be established at the windshield (such as a conductive trace, such as a transparent conductive trace or the like, established at the in-cabin surface of the windshield local to the camera module) to provide heating of the windshield at the area through which the camera views, in order to reduce moisture or fogging of the windshield at the viewing area of the camera or imager.

The vision system that utilizes the forward facing camera may also include one or more other imaging sensors or cameras (such as a rearward facing imaging sensor or camera and/or a forwardly facing camera at the front of the vehicle, and/or a sidewardly/rearwardly facing camera at the sides of the vehicle), which capture images exterior of the vehicle, with the cameras having a lens for focusing images at or onto an imaging array or imaging plane of the camera. The vision system is operable to process image data captured by the cameras and may provide displayed images at a display device for viewing by the driver of the vehicle. Optionally, the vision system may process image data to detect objects, such as objects forward of the vehicle during forward driving or such as objects to the rear of the subject or equipped vehicle during a reversing maneuver, or such as approaching or following vehicles or vehicles at a side lane adjacent to the subject or equipped vehicle or the like.

Optionally, the module 10 and camera may utilize aspects of the imaging systems and/or modules described in U.S. Pat. Nos. 8,451,332; 8,256,821; 7,946,505; 7,188,963; 7,004,593; 6,824,281; 6,968,736; 6,690,268; 6,250,148; 6,341,523; 6,593,565; 6,428,172; 6,501,387; 6,329,925 and/or 6,326,613, and/or in U.S. Publication No. US-2006-0050018, which are hereby incorporated herein by reference in their entireties. Optionally, the forward facing camera may be disposed at a module that is spaced from the windshield, such as at or near or part of the interior rearview mirror assembly, or the forward facing camera may be disposed at or in the interior rearview mirror assembly that is attached at an in-cabin portion of the vehicle, while remaining within the spirit and scope of the present invention.

The windshield may have an opaque or light absorbing or non-light-transmitting layer (such as an opaque ceramic frit layer or the like) disposed at the area of the windshield at which the bracket is mounted, with an aperture established through the opaque layer generally at the area in front of and generally aligned with the imager assembly when the bracket and camera housing are attached at the windshield and with the same aperture or a second aperture also aligned with any rain sensor used, so that the camera and the rain sensor can view through the windshield through the aperture or apertures formed through the opaque frit layer.

When the camera module is attached at the bracket at the windshield, the imager assembly has a field of view through the aperture in the opaque layer at the windshield W, with no obstruction in the field of view of the imager. The field of view of the imager is set (such as by the bracket configuration) to be at or slightly above horizontal (such as, for example, at about 0.5 degrees or more above horizontal or about 1 degree above horizontal or at about 2 degrees above horizontal or thereabouts), with the field of view of the imager encompassing the ground ahead of the equipped vehicle at less than about 7 m from the imager. The stray light shield is arranged so that it extends from the lens of the imager to where the field of view of the imager crosses the windshield. The camera module and bracket configuration also provide for the imager to be mounted at the windshield at a location that is a reduced distance from the windshield (such as less than about 4 mm, preferably less than about 2 mm and preferably about 2.0+/−1.9 mm or thereabouts).

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The vehicle and/or vision system includes an image processor operable to process image data captured by the camera or cameras, such as for detecting objects or other vehicles or pedestrians or the like in the field of view of one or more of the cameras. For example, the image processor may comprise an EYEQ2 or EYEQ3 image processing chip available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay on the displayed image to highlight or enhance display of the detected object or vehicle, in order to enhance the driver's awareness of the detected object or vehicle or hazardous condition during a driving maneuver of the equipped vehicle.

The vehicle may include any type of sensor or sensors, such as imaging sensors or radar sensors or lidar sensors or ladar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. Preferably, the imaging array has at least 300,000 photosensor elements or pixels, more preferably at least 500,000 photosensor elements or pixels and more preferably at least 1 million photosensor elements or pixels. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or International Publication Nos. WO 2011/028686; WO 2010/099416; WO 2012/061567; WO 2012/068331; WO 2012/075250; WO 2012/103193; WO 2012/0116043; WO 2012/0145313; WO 2012/0145501; WO 2012/145818; WO 2012/145822; WO 2012/158167; WO 2012/075250; WO 2012/0116043; WO 2012/0145501; WO 2012/154919; WO 2013/019707; WO 2013/016409; WO 2013/019795; WO 2013/067083; WO 2013/070539; WO 2013/043661; WO 2013/048994; WO 2013/063014, WO 2013/081984; WO 2013/081985; WO 2013/074604; WO 2013/086249; WO 2013/103548; WO 2013/109869; WO 2013/123161; WO 2013/126715; WO 2013/043661 and/or WO 2013/158592, which are all hereby incorporated herein by reference in their entireties. The system may communicate with other communication systems via any suitable means, such as by utilizing aspects of the systems described in International Publication Nos. WO 2010/144900; WO 2013/043661 and/or WO 2013/081985, and/or U.S. Publication No. US-2012-0062743, which are hereby incorporated herein by reference in their entireties.

The imaging device and control and image processor and any associated illumination source, if applicable, may comprise any suitable components, and may utilize aspects of the cameras and vision systems described in U.S. Pat. Nos. 5,550,677; 5,877,897; 6,498,620; 5,670,935; 5,796,094; 6,396,397; 6,806,452; 6,690,268; 7,005,974; 7,937,667; 7,123,168; 7,004,606; 6,946,978; 7,038,577; 6,353,392; 6,320,176; 6,313,454 and 6,824,281, and/or International Publication Nos. WO 2010/099416; WO 2011/028686 and/or WO 2013/016409, and/or U.S. Publication Nos. US 2010-0020170 and/or US-2013-0002873, which are all hereby incorporated herein by reference in their entireties. The camera or cameras may comprise any suitable cameras or imaging sensors or camera modules, and may utilize aspects of the cameras or sensors described in U.S. Publication No. US-2009-0244361 and/or U.S. Pat. Nos. 8,542,451; 7,965,336 and/or 7,480,149, which are hereby incorporated herein by reference in their entireties. The imaging array sensor may comprise any suitable sensor, and may utilize various imaging sensors or imaging array sensors or cameras or the like, such as a CMOS imaging array sensor, a CCD sensor or other sensors or the like, such as the types described in U.S. Pat. Nos. 5,550,677; 5,670,935; 5,760,962; 5,715,093; 5,877,897; 6,922,292; 6,757,109; 6,717,610; 6,590,719; 6,201,642; 6,498,620; 5,796,094; 6,097,023; 6,320,176; 6,559,435; 6,831,261; 6,806,452; 6,396,397; 6,822,563; 6,946,978; 7,339,149; 7,038,577; 7,004,606; 7,720,580 and/or 7,965,336, and/or International Publication Nos. WO 2009/036176 and/or WO 2009/046268, which are all hereby incorporated herein by reference in their entireties.

The camera module and circuit chip or board and imaging sensor may be implemented and operated in connection with various vehicular vision-based systems, and/or may be operable utilizing the principles of such other vehicular systems, such as a vehicle headlamp control system, such as the type disclosed in U.S. Pat. Nos. 5,796,094; 6,097,023; 6,320,176; 6,559,435; 6,831,261; 7,004,606; 7,339,149 and/or 7,526,103, which are all hereby incorporated herein by reference in their entireties, a rain sensor, such as the types disclosed in commonly assigned U.S. Pat. Nos. 6,353,392; 6,313,454; 6,320,176 and/or 7,480,149, which are hereby incorporated herein by reference in their entireties, a vehicle vision system, such as a forwardly, sidewardly or rearwardly directed vehicle vision system utilizing principles disclosed in U.S. Pat. Nos. 5,550,677; 5,670,935; 5,760,962; 5,877,897; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,005,974 and/or 7,859,565, which are all hereby incorporated herein by reference in their entireties, a reverse or sideward imaging system, such as for a lane change assistance system or lane departure warning system or for a blind spot or object detection system, such as imaging or detection systems of the types disclosed in U.S. Pat. Nos. 7,881,496; 7,720,580; 7,038,577; 5,929,786 and/or 5,786,772, which are hereby incorporated herein by reference in their entireties, a video device for internal cabin surveillance and/or video telephone function, such as disclosed in U.S. Pat. Nos. 5,760,962; 5,877,897; 6,690,268 and/or 7,370,983, and/or U.S. Publication No. US-2006-0050018, which are hereby incorporated herein by reference in their entireties, a traffic sign recognition system, a system for determining a distance to a leading or trailing vehicle or object, such as a system utilizing the principles disclosed in U.S. Pat. Nos. 6,396,397 and/or 7,123,168, which are hereby incorporated herein by reference in their entireties, and/or the like.

Optionally, the circuit board or chip may include circuitry for the imaging array sensor and or other electronic accessories or features, such as by utilizing compass-on-a-chip or EC driver-on-a-chip technology and aspects such as described in U.S. Pat. Nos. 7,255,451 and/or 7,480,149, and/or U.S. Publication Nos. US-2010-0097469 and/or US-2006-0061008, which are hereby incorporated herein by reference in their entireties.

Optionally, the vision system may include a display for displaying images captured by one or more of the imaging sensors for viewing by the driver of the vehicle while the driver is normally operating the vehicle. Optionally, for example, the vision system may include a video display device disposed at or in the interior rearview mirror assembly of the vehicle, such as by utilizing aspects of the video mirror display systems described in U.S. Pat. No. 6,690,268 and/or U.S. Publication No. US-2012-0162427, which are hereby incorporated herein by reference in their entireties. The video mirror display may comprise any suitable devices and systems and optionally may utilize aspects of the compass display systems described in U.S. Pat. Nos. 7,370,983; 7,329,013; 7,308,341; 7,289,037; 7,249,860; 7,004,593; 4,546,551; 5,699,044; 4,953,305; 5,576,687; 5,632,092; 5,677,851; 5,708,410; 5,737,226; 5,802,727; 5,878,370; 6,087,953; 6,173,508; 6,222,460; 6,513,252 and/or 6,642,851, and/or European patent application, published Oct. 11, 2000 under Publication No. EP 0 1043566, and/or U.S. Publication No. US-2006-0061008, which are all hereby incorporated herein by reference in their entireties. Optionally, the video mirror display screen or device may be operable to display images captured by a rearward viewing camera of the vehicle during a reversing maneuver of the vehicle (such as responsive to the vehicle gear actuator being placed in a reverse gear position or the like) to assist the driver in backing up the vehicle, and optionally may be operable to display the compass heading or directional heading character or icon when the vehicle is not undertaking a reversing maneuver, such as when the vehicle is being driven in a forward direction along a road (such as by utilizing aspects of the display system described in International Publication No. WO 2012/051500, which is hereby incorporated herein by reference in its entirety).

Optionally, the vision system (utilizing the forward facing camera and a rearward facing camera and other cameras disposed at the vehicle with exterior fields of view) may be part of or may provide a display of a top-down view or birds-eye view system of the vehicle or a surround view at the vehicle, such as by utilizing aspects of the vision systems described in International Publication Nos. WO 2010/099416; WO 2011/028686; WO 2012/075250; WO 2013/019795; WO 2012/075250; WO 2012/145822; WO 2013/081985; WO 2013/086249 and/or WO 2013/109869, and/or U.S. Publication No. US-2012-0162427, which are hereby incorporated herein by reference in their entireties.

Optionally, a video mirror display may be disposed rearward of and behind the reflective element assembly and may comprise a display such as the types disclosed in U.S. Pat. Nos. 5,530,240; 6,329,925; 7,855,755; 7,626,749; 7,581,859; 7,446,650; 7,370,983; 7,338,177; 7,274,501; 7,255,451; 7,195,381; 7,184,190; 5,668,663; 5,724,187 and/or 6,690,268, and/or in U.S. Publication Nos. US-2006-0061008 and/or US-2006-0050018, which are all hereby incorporated herein by reference in their entireties. The display is viewable through the reflective element when the display is activated to display information. The display element may be any type of display element, such as a vacuum fluorescent (VF) display element, a light emitting diode (LED) display element, such as an organic light emitting diode (OLED) or an inorganic light emitting diode, an electroluminescent (EL) display element, a liquid crystal display (LCD) element, a video screen display element or backlit thin film transistor (TFT) display element or the like, and may be operable to display various information (as discrete characters, icons or the like, or in a multi-pixel manner) to the driver of the vehicle, such as passenger side inflatable restraint (PSIR) information, tire pressure status, and/or the like. The mirror assembly and/or display may utilize aspects described in U.S. Pat. Nos. 7,184,190; 7,255,451; 7,446,924 and/or 7,338,177, which are all hereby incorporated herein by reference in their entireties. The thicknesses and materials of the coatings on the substrates of the reflective element may be selected to provide a desired color or tint to the mirror reflective element, such as a blue colored reflector, such as is known in the art and such as described in U.S. Pat. Nos. 5,910,854; 6,420,036 and/or 7,274,501, which are hereby incorporated herein by reference in their entireties.

Optionally, the display or displays and any associated user inputs may be associated with various accessories or systems, such as, for example, a tire pressure monitoring system or a passenger air bag status or a garage door opening system or a telematics system or any other accessory or system of the mirror assembly or of the vehicle or of an accessory module or console of the vehicle, such as an accessory module or console of the types described in U.S. Pat. Nos. 7,289,037; 6,877,888; 6,824,281; 6,690,268; 6,672,744;

6,386,742 and/or 6,124,886, and/or U.S. Publication No. US-2006-0050018, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular vision system, the vehicular vision system comprising:
a camera module configured for mounting at an in-cabin side of a windshield of a vehicle equipped with said vehicular vision system;
wherein said camera module comprises a camera housing having an upper housing portion and a lower housing portion;
wherein said camera housing, with said upper housing portion connected to said lower housing portion, houses at least (i) electronic circuitry disposed at a main printed circuit board (main PCB) and (ii) an imager assembly;
wherein said imager assembly comprises a lens holder, said lens holder comprising an elongated lens barrel that houses at least one lens;
wherein said elongated lens barrel protrudes outward from said camera housing;
wherein said elongated lens barrel comprises a cylindrically-shaped portion;
wherein, as accommodated at said camera module, said elongated lens barrel of said lens holder is at an acute angle α relative to said main PCB;
wherein said imager assembly comprises an imager printed circuit board (imager PCB);
wherein said imager PCB comprises a front side and a rear side that is spaced from said front side by a thickness dimension of said imager PCB;
wherein electronic circuitry of said imager PCB of said imager assembly comprises a CMOS imaging array sensor, and wherein said CMOS imaging array sensor is disposed at said front side of said imager PCB;
wherein said CMOS imaging array sensor comprises a two-dimensional array of rows and columns of photosensing elements and comprises at least one million photosensing elements;
wherein the at least one lens is aligned with said CMOS imaging array sensor;
wherein said main PCB has an upper side and a lower side that is spaced from said upper side by a thickness dimension of said main PCB;
wherein image data captured by said CMOS imaging array sensor is conveyed from said imager PCB to electronic circuitry disposed at said main PCB;
wherein said lower side of said main PCB faces said lower housing portion and said upper side of said main PCB faces said upper housing portion;
wherein the electronic circuitry of said main PCB is disposed at said upper side of said main PCB and at said lower side of said main PCB;
wherein an electronic component of the electronic circuitry disposed at said main PCB is in thermal conductivity with a thermal element;
wherein said thermal element is in thermal conductivity with said lower housing portion of said camera housing and, during operation of said camera module, enhances heat transfer from the electronic component of the electronic circuitry disposed at said main PCB to said lower housing portion of said camera housing;
wherein said camera housing is configured for mounting said camera module at a bracket attached at the in-cabin side of the windshield of the equipped vehicle, and wherein, with said camera module mounted at the bracket attached at the in-cabin side of the windshield of the equipped vehicle, said CMOS imaging array sensor views forward of the equipped vehicle through the windshield; and
wherein, with said camera module mounted at the bracket attached at the in-cabin side of the windshield of the equipped vehicle, said camera module may be detached for replacement or service with the bracket remaining attached at the windshield.

2. The vehicular vision system of claim 1, wherein the electronic circuitry of said main PCB that is disposed at said lower side of said main PCB comprises an image processing chip.

3. The vehicular vision system of claim 1, wherein said front side of said imager PCB is attached at said lens holder.

4. The vehicular vision system of claim 3, wherein, with said front side of said imager PCB attached at said lens holder, said elongated lens barrel is aligned with said CMOS imaging array sensor.

5. The vehicular vision system of claim 4, wherein said elongated lens barrel is perpendicular to said imager PCB.

6. The vehicular vision system of claim 5, wherein, as accommodated at said camera module, said imager PCB is at an obtuse angle β relative to said main PCB.

7. The vehicular vision system of claim 6, wherein β=α+90 degrees.

8. The vehicular vision system of claim 1, wherein said camera housing comprises an aperture.

9. The vehicular vision system of claim 8, wherein said elongated lens barrel passes through said aperture.

10. The vehicular vision system of claim 1, wherein said thermal element comprises a thermally conductive paste.

11. The vehicular vision system of claim 1, wherein said thermal element comprises a thermally conductive pad.

12. The vehicular vision system of claim 1, wherein said imager assembly is at least partially disposed above said upper side of said main PCB, and wherein said CMOS imaging array sensor views through an aperture of said camera housing.

13. The vehicular vision system of claim 1, wherein a flexible cable electrically connects electronic circuitry disposed at said imager PCB with electronic circuitry disposed at said main PCB at said lower side of said main PCB.

14. The vehicular vision system of claim 13, wherein image data captured by said CMOS imaging array sensor is conveyed via said flexible cable from said imager PCB to electronic circuitry disposed at said main PCB.

15. The vehicular vision system of claim 1, wherein said camera housing comprises fins configured to dissipate heat transferred from the electronic component of the electronic circuitry disposed at said main PCB to said lower housing portion of said camera housing.

16. The vehicular vision system of claim 1, wherein, with said camera module mounted at the in-cabin side of the windshield of the equipped vehicle, a stray light shield is disposed between said camera module and the windshield.

17. The vehicular vision system of claim 16, wherein the bracket attaches at the in-cabin side of the windshield via adhesive attachment.

18. The vehicular vision system of claim 16, wherein the bracket comprises the stray light shield.

19. The vehicular vision system of claim 16, wherein the stray light shield is separate from the bracket.

20. A vehicular vision system, the vehicular vision system comprising:

a camera module configured for mounting at an in-cabin side of a windshield of a vehicle equipped with said vehicular vision system;

wherein said camera module comprises a camera housing having an upper housing portion and a lower housing portion;

wherein said camera housing, with said upper housing portion connected to said lower housing portion, houses at least (i) electronic circuitry disposed at a main printed circuit board (main PCB) and (ii) an imager assembly;

wherein said imager assembly comprises a lens holder, said lens holder comprising an elongated lens barrel that houses at least one lens;

wherein said elongated lens barrel protrudes outward from said camera housing;

wherein, as accommodated at said camera module, said elongated lens barrel of said lens holder is at an acute angle α relative to said main PCB;

wherein said imager assembly comprises an imager printed circuit board (imager PCB), wherein said imager PCB comprises a front side and a rear side that is spaced from said front side by a thickness dimension of said imager PCB;

wherein said front side of said imager PCB is attached at said lens holder;

wherein electronic circuitry of said imager PCB of said imager assembly comprises a CMOS imaging array sensor, and wherein said CMOS imaging array sensor is disposed at said front side of said imager PCB;

wherein said CMOS imaging array sensor comprises a two-dimensional array of rows and columns of photosensing elements and comprises at least one million photosensing elements;

wherein, with said front side of said imager PCB attached at said lens holder, said elongated lens barrel is perpendicular to said imager PCB;

wherein, with said front side of said imager PCB attached at said lens holder, the at least one lens is aligned with said CMOS imaging array sensor;

wherein said main PCB has an upper side and a lower side that is spaced from said upper side by a thickness dimension of said main PCB;

wherein image data captured by said CMOS imaging array sensor is conveyed from said imager PCB to electronic circuitry disposed at said main PCB;

wherein said lower side of said main PCB faces said lower housing portion and said upper side of said main PCB faces said upper housing portion;

wherein the electronic circuitry of said main PCB is disposed at said upper side of said main PCB and at said lower side of said main PCB;

wherein an electronic component of the electronic circuitry disposed at said main PCB is in thermal conductivity with a thermal element;

wherein said thermal element is in thermal conductivity with said lower housing portion of said camera housing and, during operation of said camera module, enhances heat transfer from the electronic component of the electronic circuitry disposed at said main PCB to said lower housing portion of said camera housing;

wherein said camera housing is configured for mounting said camera module at a bracket attached at the in-cabin side of the windshield of the equipped vehicle, and wherein, with said camera module mounted at the bracket attached at the in-cabin side of the windshield of the equipped vehicle, said CMOS imaging array sensor views forward of the equipped vehicle through the windshield; and wherein, with said camera module mounted at the bracket attached at the in-cabin side of the windshield of the equipped vehicle, said camera module may be detached for replacement or service with the bracket remaining attached at the windshield.

21. The vehicular vision system of claim 20, wherein the electronic circuitry of said main PCB that is disposed at said lower side of said main PCB comprises an image processing chip.

22. The vehicular vision system of claim 20, wherein, as accommodated at said camera module, said imager PCB is at an obtuse angle β relative to said main PCB.

23. The vehicular vision system of claim 22, wherein β=α+90 degrees.

24. The vehicular vision system of claim 20, wherein said elongated lens barrel passes through an aperture of said camera housing.

25. The vehicular vision system of claim 20, wherein said thermal element comprises a thermally conductive paste.

26. The vehicular vision system of claim 20, wherein said thermal element comprises a thermally conductive pad.

27. The vehicular vision system of claim 20, wherein a flexible cable electrically connects electronic circuitry disposed at said imager PCB with electronic circuitry disposed at said main PCB at said lower side of said main PCB.

28. The vehicular vision system of claim 20, wherein said camera housing comprises fins configured to dissipate heat transferred from the electronic component of the electronic circuitry disposed at said main PCB to said lower housing portion of said camera housing.

29. The vehicular vision system of claim 20, wherein, with said camera module mounted at the in-cabin side of the windshield of the equipped vehicle, a stray light shield is disposed between said camera module and the windshield.

30. A vehicular vision system, the vehicular vision system comprising:

a camera module configured for mounting at an in-cabin side of a windshield of a vehicle equipped with said vehicular vision system;

wherein said camera module comprises a camera housing having an upper housing portion and a lower housing portion;

wherein said camera housing, with said upper housing portion connected to said lower housing portion, houses at least (i) electronic circuitry disposed at a main printed circuit board (main PCB) and (ii) an imager assembly;

wherein said imager assembly comprises a lens holder, said lens holder comprising an elongated lens barrel that houses at least one lens;

wherein said elongated lens barrel protrudes through an aperture of said camera housing;

wherein, as accommodated at said camera module, said elongated lens barrel of said lens holder is at an acute angle α relative to said main PCB;

wherein said imager assembly comprises an imager printed circuit board (imager PCB);

wherein said imager PCB comprises a front side and a rear side that is spaced from said front side by a thickness dimension of said imager PCB;

wherein said front side of said imager PCB is attached at said lens holder;

wherein electronic circuitry of said imager PCB of said imager assembly comprises a CMOS imaging array sensor, and wherein said CMOS imaging array sensor is disposed at said front side of said imager PCB;

wherein said CMOS imaging array sensor comprises a two-dimensional array of rows and columns of photosensing elements and comprises at least one million photosensing elements;

wherein, with said front side of said imager PCB attached at said lens holder, the at least one lens is aligned with said CMOS imaging array sensor;

wherein said main PCB has an upper side and a lower side that is spaced from said upper side by a thickness dimension of said main PCB;

wherein image data captured by said CMOS imaging array sensor is conveyed from said imager PCB to electronic circuitry disposed at said main PCB;

wherein said lower side of said main PCB faces said lower housing portion and said upper side of said main PCB faces said upper housing portion;

wherein the electronic circuitry of said main PCB is disposed at said upper side of said main PCB and at said lower side of said main PCB;

wherein an electronic component of the electronic circuitry disposed at said main PCB is in thermal conductivity with a thermal element;

wherein said thermal element is in thermal conductivity with said lower housing portion of said camera housing and, during operation of said camera module, enhances heat transfer from the electronic component of the electronic circuitry disposed at said main PCB to said lower housing portion of said camera housing;

wherein said camera housing is configured for mounting said camera module at a bracket attached at the in-cabin side of the windshield of the equipped vehicle, and wherein, with said camera module mounted at the bracket attached at the in-cabin side of the windshield of the equipped vehicle, said CMOS imaging array sensor views forward of the equipped vehicle through the windshield;

wherein, with said camera module mounted at the in-cabin side of the windshield of the equipped vehicle, a stray light shield is disposed between said camera module and the windshield;

wherein the stray light shield is separate from the bracket; and wherein, with said camera module mounted at the bracket attached at the in-cabin side of the windshield of the equipped vehicle, said camera module may be detached for replacement or service with the bracket remaining attached at the windshield.

31. The vehicular vision system of claim 30, wherein the electronic circuitry of said main PCB that is disposed at said lower side of said main PCB comprises an image processing chip.

32. The vehicular vision system of claim 30, wherein, as accommodated at said camera module, said imager PCB is at an obtuse angle $\beta$ relative to said main PCB.

33. The vehicular vision system of claim 32, wherein $\beta = \alpha + 90$ degrees.

34. The vehicular vision system of claim 30, wherein said thermal element comprises a thermally conductive paste.

35. The vehicular vision system of claim 30, wherein said thermal element comprises a thermally conductive pad.

36. The vehicular vision system of claim 30, wherein a flexible cable electrically connects electronic circuitry disposed at said imager PCB with electronic circuitry disposed at said main PCB at said lower side of said main PCB.

37. The vehicular vision system of claim 30, wherein said camera housing comprises fins configured to dissipate heat transferred from the electronic component of the electronic circuitry disposed at said main PCB to said lower housing portion of said camera housing.

* * * * *